(12) United States Patent
Su et al.

(10) Patent No.: US 9,942,984 B1
(45) Date of Patent: Apr. 10, 2018

(54) ATTENUATION REDUCTION STRUCTURE FOR FLEXIBLE CIRCUIT BOARD

(71) Applicant: ADVANCED FLEXIBLE CIRCUITS CO., LTD., Zhongli (TW)

(72) Inventors: Kuo-Fu Su, Zhongli (TW); Chih-Heng Chuo, Bade (TW); Gwun-Jin Lin, Taoyuan (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 0 days.

(21) Appl. No.: 15/664,031

(22) Filed: Jul. 31, 2017

(30) Foreign Application Priority Data

Mar. 17, 2017 (TW) .............................. 106109226 A

(51) Int. Cl.
| H05K 1/00 | (2006.01) |
| H05K 1/09 | (2006.01) |
| H05K 1/02 | (2006.01) |
| H05K 9/00 | (2006.01) |

(52) U.S. Cl.
CPC .............. *H05K 1/09* (2013.01); *H05K 1/028* (2013.01); *H05K 1/0245* (2013.01); *H05K 9/0084* (2013.01)

(58) Field of Classification Search
CPC ................. H05K 1/0218; H05K 3/323; H05K 2203/0278; H05K 2201/0715; H05K 9/0088
See application file for complete search history.

(56) References Cited

U.S. PATENT DOCUMENTS

| 6,335,492 | B1 * | 1/2002 | Terasaka | ........... | H01L 23/49811 |
| | | | | | 174/261 |
| 8,766,437 | B2 * | 7/2014 | Yamamoto | ............. | H05K 3/323 |
| | | | | | 257/737 |
| 9,609,793 | B2 * | 3/2017 | Kawaguchi | .......... | H05K 9/0088 |
| 2003/0080826 | A1 * | 5/2003 | Chen | ....................... | H01P 5/222 |
| | | | | | 333/117 |
| 2006/0248712 | A1 * | 11/2006 | Jo | ........................ | H05K 1/0218 |
| | | | | | 29/830 |
| 2008/0143358 | A1 * | 6/2008 | Breilinger | .............. | G01R 1/18 |
| | | | | | 324/750.26 |

(Continued)

FOREIGN PATENT DOCUMENTS

JP          2006229157 A   *  8/2006

*Primary Examiner* — Chau N Nguyen
*Assistant Examiner* — Roshn Varghese
(74) *Attorney, Agent, or Firm* — Rosenberg, Klein & Lee

(57) ABSTRACT

A signal attenuation reduction structure for a flexible circuit board includes a conductive paste coating zones formed on surfaces of high-frequency signal lines and an insulation layer formed on a dielectric layer of the flexible circuit board such that the conductive paste coating zone corresponds to a pair of high-frequency signal lines or covers a plurality of pairs of the high-frequency signal lines. An anisotropic conductive film is formed on surfaces of the insulation layer and the conductive paste coating zone of the flexible circuit board. The anisotropic conductive film is pressed to bond between the conductive paste coating zone and a shielding layer such that the conductive paste coating zone and the shielding layer achieve electrical connection therebetween in a vertical direction through the anisotropic conductive film.

12 Claims, 2 Drawing Sheets

(56) References Cited

U.S. PATENT DOCUMENTS

| | | | |
|---|---|---|---|
| 2009/0038839 A1* | 2/2009 | Hashimoto | H05K 1/0218 174/350 |
| 2009/0188702 A1* | 7/2009 | Muro | H05K 1/0218 174/254 |
| 2014/0374147 A1* | 12/2014 | Lin | H05K 1/0225 174/254 |
| 2015/0250080 A1* | 9/2015 | Haruna | H05K 1/0215 174/394 |
| 2016/0205817 A1* | 7/2016 | Tajima | H05K 1/0216 174/350 |

* cited by examiner

ATTENUATION REDUCTION STRUCTURE FOR FLEXIBLE CIRCUIT BOARD

BACKGROUND OF THE INVENTION

1. Field of the Invention

The present invention relates to a signal attenuation shielding structure of a flexible circuit board, and in particular to a signal attenuation reduction structure that is formed by arranging a conductive paste coating zone in a flexible circuit board to correspond to at least one high-frequency signal line and an anisotropic conductive film arranged to provide electrical connection in a vertical direction between the conductive paste coating zone and a shielding layer.

2. The Related Arts

For all sorts of electronic devices that are contemporarily available, the amount of data transmitting through signal lines is getting larger and larger and thus, the number of signal transmission lines required is increased and frequencies at which signals are transmitting are also getting higher and higher.

A high frequency signal transmission technique is achieved with two high frequency signal lines that are grouped as a signal pair to respectively transmit signals having identical amplitude, but at opposite phases so that the signal transmission lines are provided with an improved effect of suppressing electromagnetic interference.

Although such a high frequency transmission technique greatly improves potential problems that might occur in the transmission of signals, yet poor designs may often cause problems, such as signal reflection, dispersion of electromagnetic wave, loss of signal in transmission and receipt, and signal waveform distortion, in actual applications.

To suppress problems concerning interference of electromagnetic wave radiation and impedance match occurring in a high frequency signal line of a flexible circuit board, it is common to adopt a structure including a copper- or aluminum-based shielding layer; however, the thickness involved is relatively large and flexibility is poor. It is also common heretofore to form such a shielding layer by coating a silver paste layer; however, material cost is high and manufacturing processes are complicated.

SUMMARY OF THE INVENTION

In view of the drawbacks of the prior art, an objective of the present invention is to provide a high-frequency signal attenuation reduction structure that is formed by combining a conductive paste coating zone, anisotropic conductive film, and a shielding layer together.

The technical solution that the present invention adopts to achieve the above objective is that a conductive paste coating zone is formed on a surface of high-frequency signal lines and an insulation layer that are formed on a dielectric layer a flexible circuit board such that the conductive paste coating zone corresponds to a pair of high-frequency signal lines or covers a plurality of pairs of high-frequency signal lines. An anisotropic conductive film is formed on surfaces of the insulation layer and the conductive paste coating zone of the flexible circuit board. The anisotropic conductive film is pressed to bond between the conductive paste coating zone and a shielding layer such that the conductive paste coating zone and the shielding layer achieve electrical connection therebetween in a vertical direction by means of the anisotropic conductive film.

In the above solution, the conductive paste coating zone is formed of a conductive paste selected from one of silver paste, copper paste, and aluminum paste.

In the above solution, the shielding layer is formed of a material selected from one of silver, copper, aluminum, and gold.

In the above solution, the dielectric layer comprises at least one grounding line formed thereon and the grounding line is electrically connected through a conductive path to the shielding layer In the above solution, the anisotropic conductive film is pressed at a predetermined temperature and a predetermined pressure to bond between the conductive paste coating zone and the shielding layer.

In the above solution, the plurality of pairs of high-frequency signal lines comprise at least one pair of differential-mode signal lines.

In another embodiment of the present invention, the conductive paste coating zone is coated in an area that covers a plurality of pairs of high-frequency signal lines.

The efficacy of the present invention is that, as compared to the structure of the prior art copper- or aluminum-based shielding layer, the present invention offers advantages including having a smaller thickness and better flexibility and, as compared to the prior art shielding layer that is formed by coating a layer of silver paste, the present invention offers advantages of low material cost and simplified manufacturing process.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
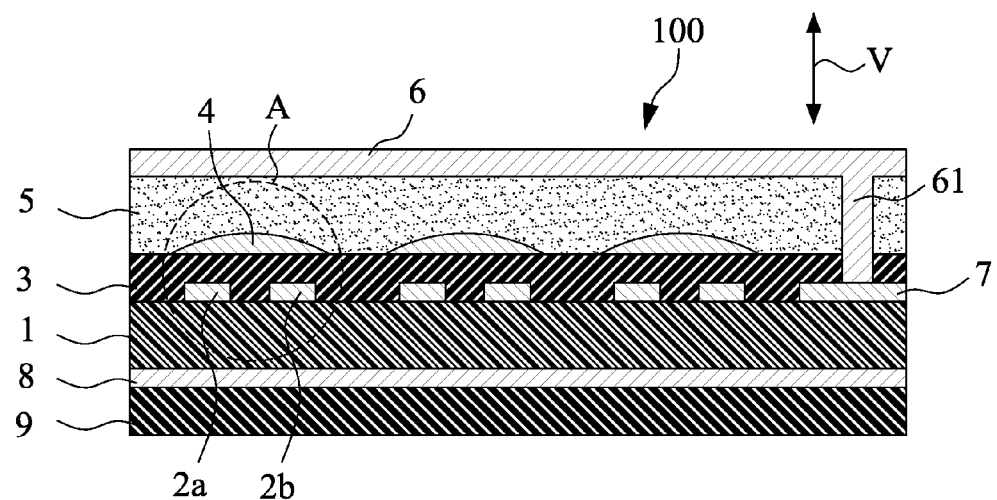
FIG. 1 is a cross-sectional diagram showing a first embodiment of the present invention.
Figure 2:
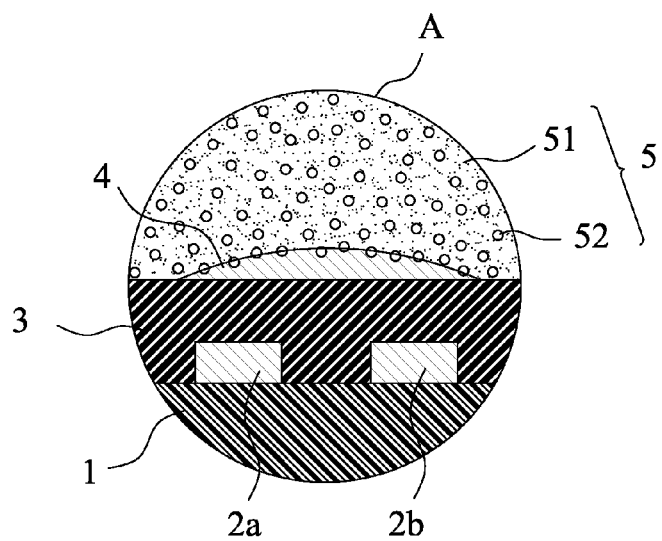
FIG. 2 is an enlarged view of a circle portion "A" of FIG. 1.

Referring collectively to FIGS. 1 and 2, FIG. 1 is a cross-sectional diagram showing a first embodiment of the present invention and FIG. 2 is an enlarged view of a circle portion "A" of FIG. 1. As shown in the drawings, a flexible circuit board 100 comprises a dielectric layer 1 on which a plurality of pairs of high-frequency signal lines 2a, 2b that are adjacent to and insulated from each other are formed. An insulation layer 3 is formed on the plurality of pairs of the high-frequency signal lines 2a, 2b and a top surface of the dielectric layer 1.

The insulation layer 3 of the flexible circuit board 100 has a surface on which a plurality of conductive paste coating zones 4 are formed through coating and each of the conductive paste coating zones 4 has a coating area that corresponds to one of the pairs of high-frequency signal lines 2a, 2b. The conductive paste coating zones 4 are formed of a conductive paste selected from one of silver paste, copper paste, and aluminum paste.

An anisotropic conductive film 5 is formed on the surfaces of the insulation layer 3 and the conductive paste coating zones 4 of the flexible circuit board 100. The anisotropic conductive film 5 is made of an insulation rein material 51 containing a plurality of conductive particles 52 therein.

A shielding layer 6 is formed on the anisotropic conductive film 5, so that the shielding layer 6 is set to cover, via the anisotropic conductive film 5, the surface of the insulation layer 3 and the surface of the conductive paste coating zones 4 of the flexible circuit board 100. The shielding layer 6 is formed of one of silver, copper, aluminum, and gold. The anisotropic conductive film 5 is pressed, at a predetermined temperature and a predetermined pressure, to bond between the conductive paste coating zones 4 and the shielding layer 6. The conductive paste coating zones 4 and the shielding layer 6 achieve an electrical connection therebetween in the vertical direction V (namely Z-axis direction) by means of the conductive particles 52 of the anisotropic conductive film 5.

The dielectric layer 1 comprises at least one grounding line 7 formed thereon and the grounding line 7 is electrically connected, via a conductive path 61, to the shielding layer 6. The dielectric layer 1 has an underside on which a conductive layer 8 is formed thereon, and then an insulation layer 9 is further formed on the conductive layer 8.

The plurality of pairs of the high-frequency signal lines 2a, 2b comprise at least one pair of differential-mode signal lines for transmission of differential-mode signals and may also comprise a common-mode signal lines for transmission of common-mode signals.

Figure 3:
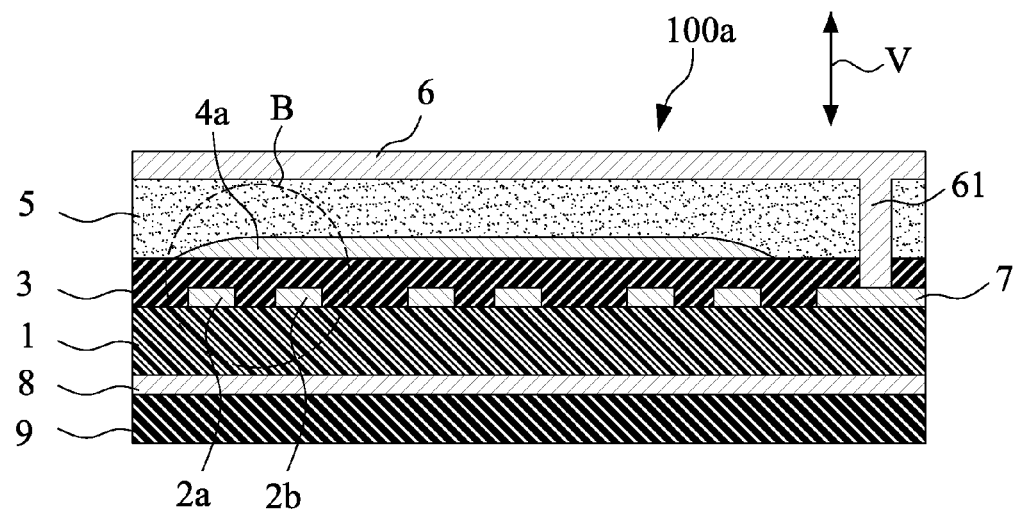
FIG. 3 is a cross-sectional diagram showing a second embodiment of the present invention.
Figure 4:
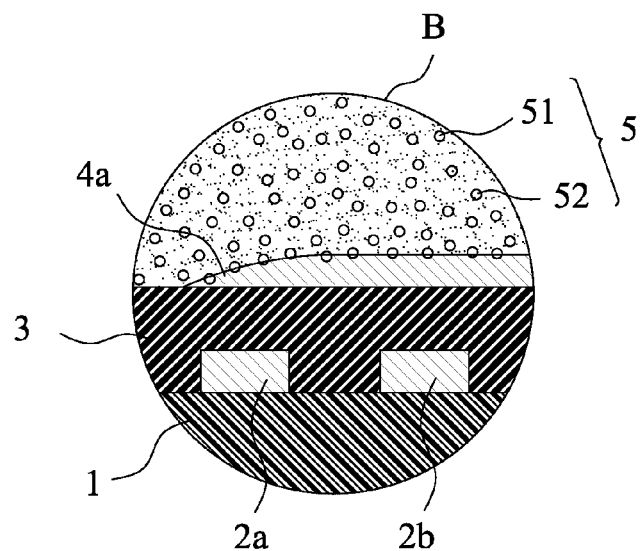
FIG. 4 is an enlarged view of a circle portion "B" of FIG. 3.

FIG. 3 is a cross-sectional diagram showing a second embodiment of the present invention. FIG. 4 is an enlarged view of a circle portion "B" of FIG. 3. The instant embodiment comprises components/parts that are generally similar to those of the first embodiment and similar components/parts are designated with the same reference numerals for consistency. In the instant embodiment, the flexible circuit board 100a similarly comprises a dielectric layer 1, a plurality of pairs of high-frequency signal lines 2a, 2b that are adjacent to and insulated from each other, an insulation layer 3, an anisotropic conductive film 5, a shielding layer 6, a grounding line 7, a conductive layer 8, and an insulation layer 9.

In the instant embodiment, a top surface of the insulation layer 3 is coated and thus formed with an extended conductive paste coating zone 4a, and the extended conductive paste coating zone 4a has an extended coating area that correspondingly covers the plurality of pairs of the high-frequency signal lines 2a, 2b. The extended conductive paste coating zone 4a is formed of conductive paste that comprises one of silver paste, copper paste, and aluminum paste.

The shielding layer 6 is set to cover, via the anisotropic conductive film 5, the surface of the insulation layer 3 and the extended conductive paste coating zone 4a of the flexible circuit board 100. The anisotropic conductive film 5 is pressed, at a predetermined temperature and a predetermined pressure, to bond between the extended conductive paste coating zone 4a and the shielding layer 6. The extended conductive paste coating zone 4a and the shielding layer 6 achieve an electrical connection therebetween in the vertical direction V (namely Z-axis direction) by means of conductive particles 52 of the anisotropic conductive film 5.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible circuit board, comprising:
   a dielectric layer having a top surface;
   a plurality of pairs of signal lines disposed for high-frequency applications adjacent to and insulated from each other, the signal lines being formed on the top surface of the dielectric layer;
   an insulation layer formed on the plurality of pairs of signal lines and the top surface of the dielectric layer;
   a plurality of conductive paste coating zones formed on the insulation layer and respectively corresponding to the plurality of pairs of signal lines;
   an anisotropic conductive film formed on the insulation layer and the conductive paste coating zones, made of different material composition from the conductive paste coating zones and including an insulation resin material containing a plurality of conductive particles therein; and
   a shielding layer formed on the anisotropic conductive film to span contiguously over the pairs of signal lines;
   wherein the conductive paste coating zones are disposed in embedded manner within the anisotropic conductive film, regions of the anisotropic conductive film thereby extending between the conductive paste coating zones and the shielding layer to establish an electrical connection between the conductive paste coating zones and the shielding layer in a vertical direction therethrough.

2. The flexible circuit board as claimed in claim 1, wherein the conductive paste coating zones are formed of a conductive paste selected from one of silver paste, copper paste, and aluminum paste.

3. The flexible circuit board as claimed in claim 1, wherein the shielding layer is formed of a material selected from one of silver, copper, aluminum, and gold.

4. The flexible circuit board as claimed in claim 1, wherein the dielectric layer includes at least one grounding line formed thereon and the grounding line is electrically connected through a conductive path to the shielding layer.

5. The flexible circuit board as claimed in claim 1, wherein the anisotropic conductive film is pressed at a predetermined temperature and a predetermined pressure to bond between the conductive paste coating zones and the shielding layer.

6. The flexible circuit board as claimed in claim 1, wherein the plurality of pairs of the signal lines include at least one pair of differential-mode signal lines.

7. A flexible circuit board, comprising:
   a dielectric layer having a top surface;
   a plurality of pairs of signal lines disposed for high-frequency applications adjacent to and insulated from each other formed on the top surface of the dielectric layer;
   an insulation layer formed on the plurality of pairs of signal lines and the top surface of the dielectric layer;
   an extended conductive paste coating zone formed on the insulation layer and corresponding to the plurality of pairs of signal lines;
   an anisotropic conductive film formed on the insulation layer and the extended conductive paste coating zone, made of different material composition from the extended conductive paste coating zone and including an insulation resin material containing a plurality of conductive particles therein; and a shielding layer formed on the anisotropic conductive film to span contiguously over the pairs of signal lines;

wherein the extended conductive paste coating zone is disposed in embedded manner within the anisotropic conductive film, a region of the anisotropic conductive film thereby extending between the extended conductive paste coating zone and the shielding layer to establish an electrical connection between the extended conductive paste coating zone and the shielding layer in a vertical direction therethrough.

8. The flexible circuit board as claimed in claim 7, wherein the extended conductive paste coating zone are formed of a conductive paste selected from one of silver paste, copper paste, and aluminum paste.

9. The flexible circuit board as claimed in claim 7, wherein the shielding layer is formed of a material selected from one of silver, copper, aluminum, and gold.

10. The flexible circuit board as claimed in claim 7, wherein the dielectric layer includes at least one grounding line formed thereon and the grounding line is electrically connected through a conductive path to the shielding layer.

11. The flexible circuit board as claimed in claim 7, wherein the anisotropic conductive film is pressed at a predetermined temperature and a predetermined pressure to bond between the extended conductive paste coating zone and the shielding layer.

12. The flexible circuit board as claimed in claim 7, wherein the plurality of pairs of the signal lines include at least one pair of differential-mode signal lines.

* * * * *